United States Patent [19]
Landry et al.

[11] Patent Number: 5,481,234
[45] Date of Patent: Jan. 2, 1996

[54] PHASE TRIMMED STRIP TRANSMISSION LINES AND METHOD FOR TRIMMING

[75] Inventors: Norman R. Landry, Mount Laurel; Edward J. Kent, Haddonfield, both of N.J.

[73] Assignee: Martin Marietta Corp., Moorestown, N.J.

[21] Appl. No.: 562,524

[22] Filed: Dec. 19, 1983

[51] Int. Cl.⁶ .................................................. H01P 3/08
[52] U.S. Cl. ............................................................. 333/238
[58] Field of Search ................................... 333/161, 238, 333/246

[56] References Cited

U.S. PATENT DOCUMENTS 3,359,513  12/1967  Kelley ..................................... 333/161

Primary Examiner—Theodore M. Blum
Attorney, Agent, or Firm—W. H. Meise; C. A. Nieves; S. A. Young

[57] ABSTRACT

The electrical length of a strip transmission line structure is adjusted by adding conductive projections from the ground planar conductors which extend in depth toward the strip conductor and in length along the strip conductor. These projections may preferably be formed by inward deformation of the ground planes at the desired locations. In strip transmission lines having the strip conductor positioned between two ground planes, projections are preferably added in aligned pairs with each ground plane providing one of the projections of the pair.

16 Claims, 3 Drawing Sheets

PHASE TRIMMED STRIP TRANSMISSION LINES AND METHOD FOR TRIMMING

The Government has rights in this invention pursuant to Contract No. N00024-81-C-5145 awarded by the Department of the Navy.

The present invention relates to the field of strip transmission lines and more particularly to adjustment of the electrical length of strip transmission lines.

Strip transmission lines are attractive for use in beamformer circuitry of phased array antennas because of their light weight and small size as compared to rectangular waveguides. Such beamformer circuitry has sum and difference output ports and a plurality of input ports. The transmission lines from each of these input ports to the sum port and the difference port should have the same electrical (phase) length at a design operating frequency. In some designs that phase length may need to be as much as 5,000° in an S-band structure. For a high performance, low sidelobe phased array the transmission line electrical lengths in degrees from a given input port to the difference port and to the sum port must be closely matched. Phase length matching within 2° RMS may be required. In an attempt to provide such close matching, printed circuit techniques are used to define the narrow or strip conductors of such strip transmission lines. The resulting network of strip conductors (disposed on a printed circuit substrate) is suspended between parallel aluminum ground planes in the case of stripline and above one ground plane in the case of microstrip.

As a result of material and manufacturing tolerances, transmission lines in the same unitary strip transmission line structure which are designed to be identical in the printed circuit may vary as much as ±15° in electrical length at 3.3 GHz. Reflections within the structure can change the length of a line. A VSWR of 1.2 might produce a 5.2° effective increase or decrease in the electrical length of a transmission line. Therefore, a means of adjusting the electrical lengths of these lines is needed which is permanent, reliable and which does not deteriorate the performance of the circuit. It is desirable that such adjustment or trimming be done without disassembling the strip transmission line or the circuit.

The present invention provides a means to adjust the length of individual strip transmission lines of a strip transmission line structure. A reliable, permanent adjustment is provided which does not tend to deteriorate the performance of the structure. The electrical length of a strip transmission line is increased by adding conductive projections which extend in depth from its ground planar conductor(s) toward its strip conductor and in length along a portion of the length of the strip conductor.

Figure 1:
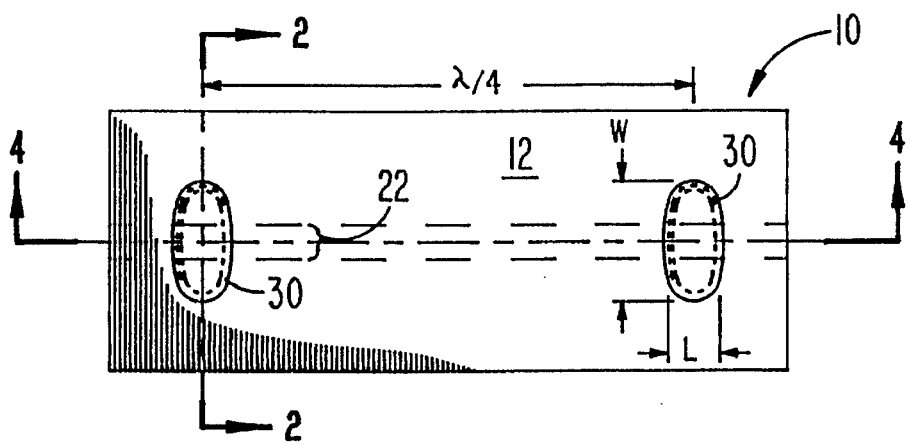
FIG. 1 illustrates one embodiment of the present invention in plan view.
Figure 2:
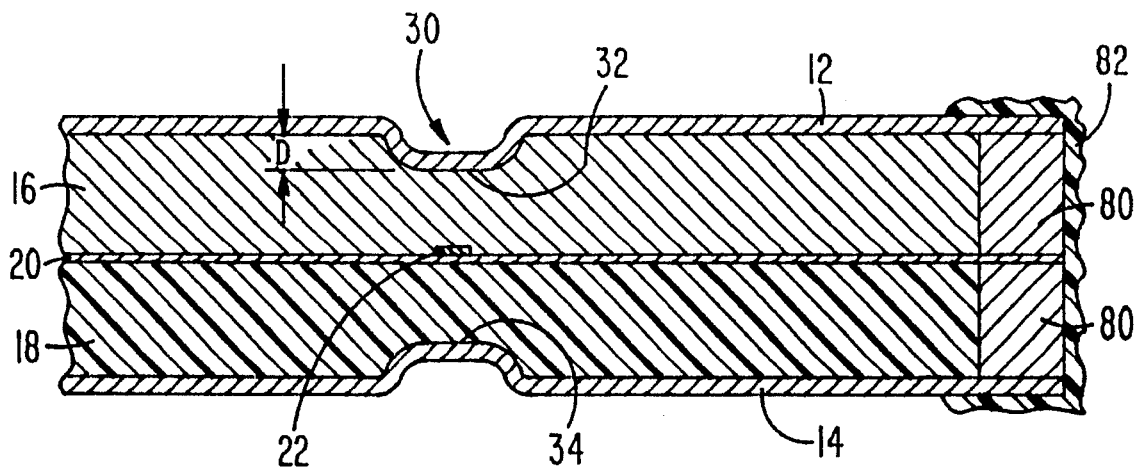
FIG. 2 illustrates a cross section through the FIG. 1 structure.

A strip transmission line 10 in accordance with the present invention is illustrated in plan view in FIG. 1 and in cross-section in FIG. 2. The cross-section in FIG. 2 is taken along the line 2—2 in FIG. 1. This strip transmission line 10 comprises upper and lower relatively broad ground planar conductors 12 and 14, respectively, upper and lower dielectric regions 16 and 18, respectively, a printed circuit substrate 20 and a printed circuit relatively narrow strip conductor 22. The ground planar conductors 12 and 14 are generally parallel and substantially planar and are at least about three times the width of the narrow strip conductor 22. Two pairs 30 of conductive projections comprising a projection 32 from the upper ground planar conductor 12 and an aligned projection 34 from the lower ground planar conductor 14 extend toward the narrow strip conductor 22. It is preferred that the ground planar conductors 12 and 14 and the dielectric material in regions 16 and 18 be of deformable material and that the projections 32 and 34 are formed in the ground planar conductors by depressions in the ground planar conductors. These projections 32 and 34 permanently change the configuration of the strip transmission line. In particular, they provide the capacitive reactance which has the effect of increasing the electrical length of the transmission line.

The capacitance induced by the projections and thus the amount of line length increase depends on the depth of the projection from the ground planar conductor toward the narrow strip conductor and the length of the projection along the length of the strip conductor. In FIG. 1, the projections 30 are illustrated as elongated in a direction perpendicular to the length of the strip conductor 22. This is in order to ensure that the projections 30 in fact extend across the full width of the strip conductor 22. Precise location of the position of the strip conductor 22 is rendered difficult by the opaque nature of the ground conductors 12 and 14. The elongated shape of the projections 30 provides a tolerance for line location thereby ensuring desired line length increase.

Figure 3:
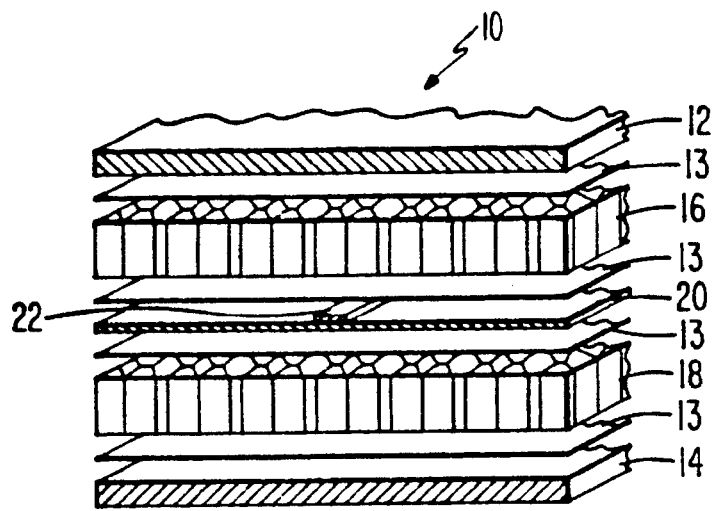
FIG. 3 illustrates in an exploded cross-section the structure of a strip transmission line in accordance with one embodiment of the invention.

A preferred structure for the strip transmission line 10 is shown in FIG. 3. This structure comprises an upper aluminum ground planar conductor 12 which may be 0.020 inch (0.051 cm) thick, an adhesive layer 13 which may be 0.002 inch (0.0051 cm) thick, a layer 16 of honeycomb dielectric which may be 0.062 inch (0.157 cm) thick and another layer 13 of the 0.002 inch (0.0051 cm) thick adhesive above the printed circuit substrate 20. The printed circuit substrate 20 may be 0.004 inch (0.010 cm) thick. The strip conductor 22, where present, may be 0.0015 inch (0.0038 cm) thick and is preferably 0.160 inch (0.406 cm) wide in order to provide a fifty ohm impedance. Below the printed circuit substrate is another adhesive layer 13, a second honeycomb dielectric layer 18 which may also be 0.062 inch (0.157 cm) thick, another layer 13 of adhesive and the lower ground planar conductor 14 which may be 0.020 inch (0.051 cm) thick aluminum. This overall strip transmission line 10 is 0.176 inch (0.447 cm) thick. The honeycomb dielectric may be of the type sold by Hexcel Corporation oriented with the walls of its hexagonal cells extending perpendicular to the plane of the printed circuit substrate 20. The adhesive is preferably a sheet adhesive such as Surlyn sold by Dupont Corporation. The substrate of the printed circuit is preferably a Teflon/glass material such as is available from Oak Corporation.

In a large structure such as the beamformer circuitry of a phased array antenna the strip transmission line structure may include many transmission lines and have exterior dimensions as large as 47 inches (119.38 cm) by 17 inches (43.18 cm) by the 0.176 inch (0.447 cm) thickness. Such a structure may preferably be completely sealed around all of its edges to exclude moisture, water and dirt. Because this strip transmission line structure is assembled with adhesives and sealed, it can not be disassembled to trim the transmission lines. Thus, to make such strip transmission lines useful in structures requiring 2° RMS line matching, an external means of adjusting electrical lengths of transmission lines is needed. This adjustment means must avoid any introduction of dirt or other foreign material into the structure.

Figure 7:
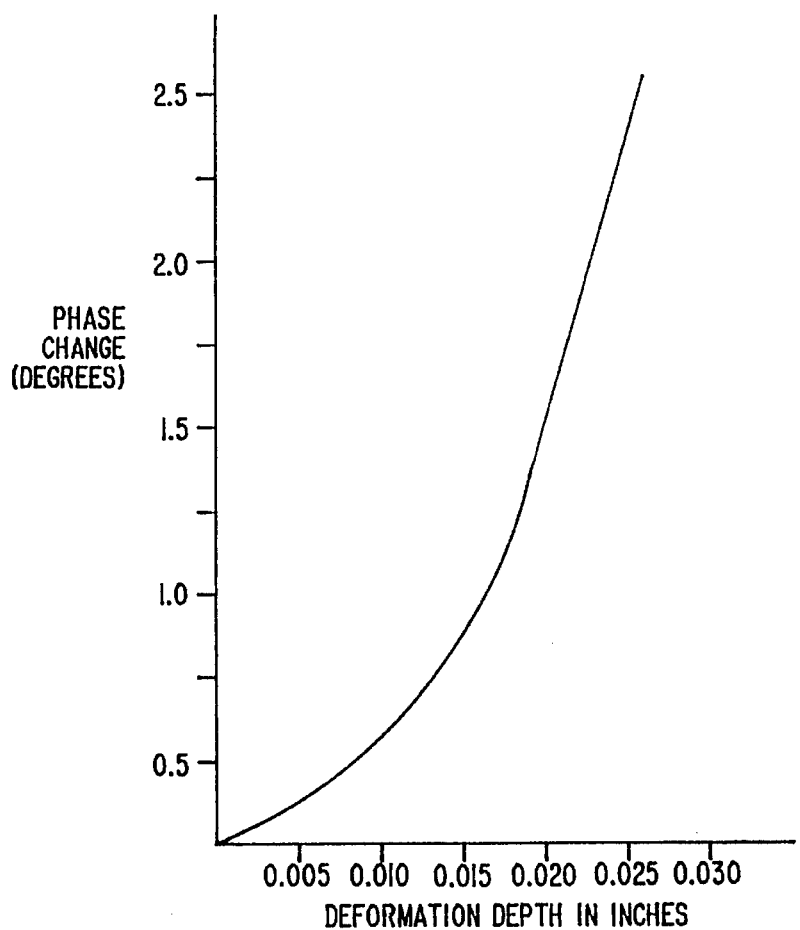
FIG. 7 is a graph of the increase in line length produced versus depth of the projection of the strip transmission line of FIG. 4.

The deformations illustrated in FIG. 2 are compatible with these objectives because they can be created in situ without puncturing the ground planes or otherwise requiring the creation of openings in the ground planes. This facilitates retention of the sealed character of the strip transmission line structure. Aligned projections 32 and 34 are preferably made the same size (depth D in FIG. 2 toward the conductor 22, length L in FIG. 1 along conductor 22 and width W in FIG. 1 perpendicular to conductor 22). This retains the symmetric structure of the strip transmission line system and thereby avoids generating parallel plate modes in signals which are transmitted through the structure. These matched projections may increase the length of the line by 2.5° for depressions 32 and 34 which have a depth D of 0.030 inch (0.076 cm) and a length L of 0.060 inch (0.152 cm). This provided the projections are over the full width of the conductor 22. The manner in which this phase change varies with the depth of the matched projections 32 and 34 is illustrated in graphic form in FIG. 7. This curve can be used to determine a depth which will create any desired phase change of less than 2.5°.

Figure 4:
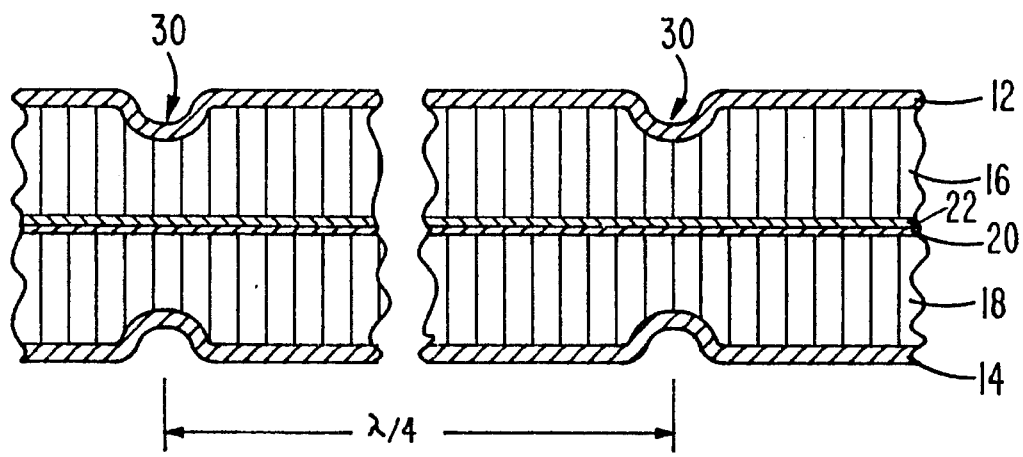
FIG. 4 is a cross-section view of the FIG. 1 structure.

A single aligned pair of projections 32 and 34 of this size produces reflections with a resulting VSWR of about 1.09. In order to reduce reflections, a second pair 30 of same size projections is placed substantially one quarter wavelength from the first pair along the conductor 22 as shown in FIG. 1 in plan view and in FIG. 4 in cross-section. These two pairs of projections comprise a doublet. As is well known in the art, such a doublet of discontinuities produces no reflection at the design (operating) frequency at which they are spaced by one quarter wavelength (λ/4). This projection spacing is measured from the center of one projection to the center of the next projection along the strip conductor 22. Where a single doublet does not provide a sufficient increase in electrical line length, a second doublet may be added to provide additional line length.

Figure 5:
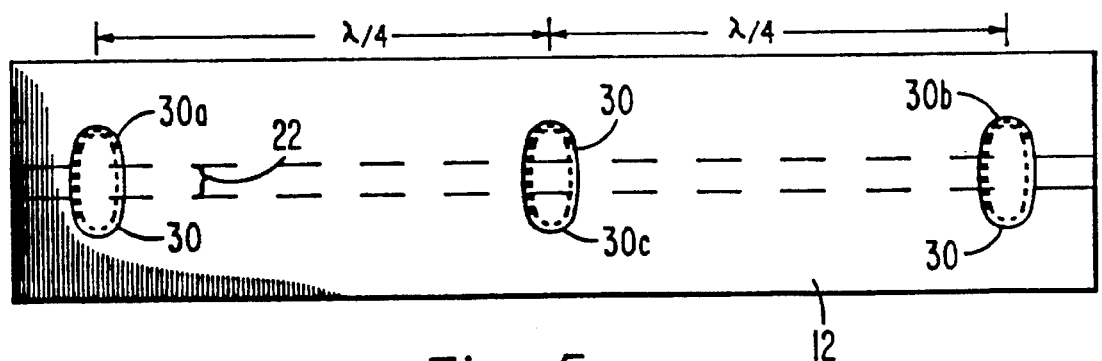
FIG. 5 is a plan view of a variation of the invention.

Also illustrated in FIG. 2 is the edge of the transmission line structure where it is sealed to prevent the intrusion of water, moisture and dirt. The dielectric regions 16 and 18 terminate a distance from the edge of the ground conductors. The resulting groves are filled with closeouts 80 which are preferably aluminum. These closeouts 80 may be secured to the ground conductors 12 and 14 and the printed circuit substrate 20 by the same adhesive layers which secure the ground conductors and printed circuit to dielectrics 16 and 18 as shown in FIG. 3. A waterproofing coating 82 which may be a urethane coating of the type PUR per military specification MIL-I-46058 is sprayed over the closeouts 80 and the ground planes 12 and 14 in that vicinity. If desired, that coating may also extend across the entire major exterior surfaces of the ground planar conductors.

Where the doublet in FIG. 1 creates too high a VSWR over an operating bandwidth for the system in which it is used, the projection configuration may be changed to triplets as illustrated in FIG. 5. The projections 30 of FIG. 5 are similar to those of FIG. 1. The two end projection pairs 30a and 30b in a triplet preferably comprise corresponding depressions 32 and 34 of the same depth and length, while the central pair 30c preferably comprises corresponding depressions which are made larger to provide about twice the phase change of the depressions 32 and 34. A depression may be made larger by making it deeper (closer to the strip conductor) or longer (along the direction of the strip conductor). For a given line length change, such triplets produce a smaller VSWR over an operating bandwidth than doublets do. A doublet or a triplet produces an electrical line length increase which is the sum of that produced by its constituent projection pairs.

Prior to adjusting the electrical lengths of lines in a beamformer, the actual or relative line lengths of all of the lines must be determined. This can be done by testing lines individually to determine their actual phase length or in pairs to determine their relative length. It is preferred to test all the lines at as close to the same time as possible. The testing is preferably done using a microwave phase analyzer such as a computer enhanced Hewett Packard model 8409. Other techniques and equipment may be used. Ground planar conductor projections or depressions are placed in accordance with which lines need to be lengthened. Such measurement techniques are well known. A common signal source may be connected to two lines and the change in differential phase introduced by the lines under test measured to determine their difference in electrical length.

Figure 6:
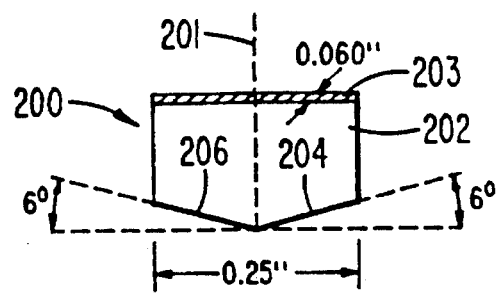
FIG. 6 is an illustration of a tool suitable for use in connection with this invention.

The ground planar conductor deformations which create the projections 32 and 34 are preferably made with a tool having a tip configuration similar to that of tool 200 illustrated in FIG. 6. This tool has an axis 201 and a 0.25 inch (0.635 cm) by 0.060 inch (0.152 cm) cross-section perpendicular to that axis. The tool 200 has a working end comprised of two face portions 204 and 206 which meet at axis 201 and form a bevel. Each face of the bevel forms an angle of about 6° with a perpendicular to the axis 201. A radius of 0.020 inch (0.051 cm) is provided on all corners to ensure that the ground planes are not ruptured by the tool. This also produces a smooth projection without sharp corners which would unnecessarily reduce the peak power handling capacity of the structure. Tools having the 0.060 inch (0.152 cm) dimension significantly reduced tended to puncture the 0.020 inch (0.051 cm) thick aluminum ground planes. The 0.25 inch (0.635 cm) dimension of the tool is about one and one half times the preferred strip conductor width of 0.160 inch (0.406 cm). The 0.060 inch (0.152 cm) dimension is about 6 electrical degrees in length at a design operating frequency of 3.3 GHz.

The projections 32 and 34 are created one at a time by rapid nutational motion of the tool tip while it is pressed against the ground planar conductor 12 or 14. Although not the preferred method, a non-beveled tool may also be struck with a hammer to create the projections. The deformations of the ground conductors may also be referred to as dents, since the adjusted or tuned strip transmission line structure appears to have random dents in its major surfaces. The adjustment process may also be referred to as "dent tunning" the strip transmission line structure. The projections may also be referred to as capacitive irises because they reduce the cross-section of the transmission line and introduce a capacitive reactance.

Where it is desired to be able to adjust the length of lines to a specific number of electrical degrees at a given operating frequency, the transmission line structure is preferably designed with the lines shorter than needed by an amount equal to the phase variation experienced in manufacturing. This ensures that, even when the manufacturing variation results in longer than designed lines, the lines will not be longer than needed. Lines which are shorter than needed then have projections (preferably in doublets or triplets) added after testing to bring the lines to the desired length.

Where only the relative line length is important (rather than an absolute line length) then it is not necessary to design the lines too-short. The lines are instead designed to desired length. Then, whichever line is relatively too-short is lengthened by the addition of projections to make the two lines the same length within the desired tolerance.

The presently preferred embodiment of this invention is the deformable ground plane/dielectric structure which has been illustrated in which projections are formed by deformation of the ground planes and dielectric. This embodiment ensures that the transmission line structure remains sealed and that the projection position and depth does not change.

An alternative, although not preferred, projection may be provided by threading a screw into a hole in the ground plane. Screws are most applicable to structures having thicker, non-deformable ground planes. Screw projections have adjustable depths, but carry with them the possibility of subsequent change due to rotation of the screw. In addition, the presence or creation of the hole through which the screw extends can result in extraneous matter being introduced into the strip transmission line structure. Such extraneous matter, particularly if it is conductive, can have a substantial adverse affect on the operation of the transmission line.

Figure 8:
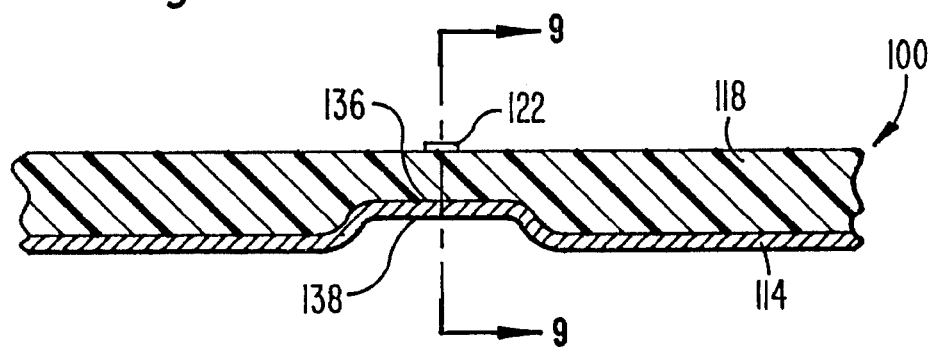
FIG. 8 is a cross-section view of a single ground plane strip transmission line version of the invention.
Figure 9:
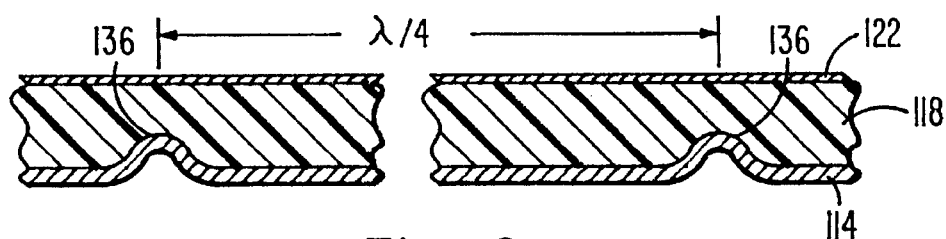
FIG. 9 is a cross-section view of a single ground plane version of the invention taken along line 9—9 of FIG. 8.

A further alternative embodiment—a single ground plane strip transmission line 100—is illustrated in two different cross sectional views in FIGS. 8 and 9. The strip transmission line 100 comprises a lower relatively broad ground planar conductor 114, a dielectric region 118 and a relatively narrow strip conductor 122. This type of structure is often referred to as a microstrip transmission line. The dielectric medium 118 and the ground plane 114 are both deformable. A projection 136 in the ground plane underlies the strip conductor 122 in the FIG. 8 view. This produces an increase in line length. The projection 136 is in the form of a depression in the ground plane 114 In a preferred form of the microstrip embodiment two projections 136 are spaced by λ/4 to form a doublet as shown in FIG. 9. This prevents these discontinuities from creating reflections at a design frequency.

The ground conductors and the strip transmission line structure have been referred to as being substantially planar. This condition is satisfied if the ground planes are locally planar even if over distances which are great compared to the thickness of the structure the entire structure curves. Such a curvature would result from conforming the structure to the contours of a slowly curving body such as an airplane fuselage.

What is claimed is:

1. In a strip transmission line of the type including a relatively narrow strip-like conductor spaced a given distance from a relatively broad substantially planar ground conductor by a dielectric medium, said substantially planar ground conductor and said dielectric medium together being deformable, said strip transmission line having a first given electrical length, the improvement for changing the electrical length comprising:

a conductive projection extending in depth from said substantially planar ground conductor toward said narrow conductor and in length along a portion of the length of said narrow conductor, said projection depth and length selected to produce a desired electrical length change and being in the form of a permanent deformation of said substantially planar ground conductor.

2. The improvement recited in claim 1 including a second conductive projection extending in depth from said substantially planar ground conductor toward said narrow conductor, being in the form of a permanent deformation of said substantially planar ground conductor and being spaced center-to-center from said first recited projection by one quarter wavelength at a design operating frequency.

3. The improvement recited in claim 1 wherein:

said transmission line includes a second substantially planar ground conductor spaced said given distance from said narrow strip-like conductor by a second dielectric medium and substantially twice said given distance from said first recited planar ground conductor, said second dielectric medium and said second ground conductor together being deformable and having a second conductive projection in the form of a permanent deformation of said second ground conductor disposed in alignment with said first recited projection.

4. In a strip transmission line of the type including a relatively narrow strip-like conductor disposed between first and second relatively broad substantially planar ground conductors and having a first given electrical length, the improvement for changing the electrical length comprising:

a pair of conductive projections in said substantially planar ground conductors, a first one of said pair of projections extending in depth from the plane of said first ground conductor toward said narrow conductor and in length along a portion of the length of said narrow conductor, a second one of said pair of projections extending in depth from the plane of said second ground conductor toward said narrow conductor and in length along a portion of the length of said narrow conductor;

said first and second projections being aligned with each other and having depths and lengths selected to produce a desired electrical length change.

5. The improvement recited in claim 4 wherein:

said projections have substantially the same depth and length.

6. The improvement recited in claim 4 further comprising a second pair of aligned conductive projections, one from the plane of each of said ground conductors, said second pair spaced from said first pair along said strip conductor by a center-to-center distance of one quarter wavelength at a design operating frequency.

7. The improvement recited in claim 4 further comprising second and third pairs of aligned projections from the plane of said ground conductors, adjacent pairs being spaced apart along said strip conductor at center-to-center intervals of one quarter wavelength at a design operating frequency.

8. The improvement recited in claim 7 wherein:

said first and third pairs of projections each have depths and lengths selected to provide a given amount of length change;

said second pair of projections between said first and third pairs of projections has depths and lengths selected to produce substantially twice the electrical length change produced by either said first or third pair.

9. In a strip transmission line of the type including a relatively narrow strip-like conductor spaced from a pair of relatively broad, parallel, substantially planar ground conductors by a dielectric medium, said substantially planar ground conductors and dielectric medium together being deformable, the improvement comprising:

a pair of aligned conductive depressions one from the plane of each of said ground conductors, each extending in depth from said substantially planar ground conductor toward said narrow conductor and in length along a portion of the length of said narrow conductor; and said depressions having depths and lengths selected to produce a desired electrical length change and being in the form of permanent deformations of said substantially planar ground conductors.

10. A method of adjusting a strip transmission line of the type which comprises a relatively narrow strip-like conductor spaced from two parallel substantially planar ground conductors by a dielectric medium, said method comprising:

assembling said strip transmission line structure;

testing said strip transmission line to determine the electrical length of said strip transmission line at a design frequency; and if said strip transmission line is electrically too short, adding one or more conductive projections to said substantially planar ground conductors, each projection extending in depth from the plane of said ground conductor toward said strip conductor and in length along a portion of the length of said strip conductor, said depths and lengths selected to produce a desired change in the electrical length of said strip transmission line.

11. The method recited in claim 10 wherein said ground conductors and said dielectric medium together are deformable and said step of adding a conductive projection comprises:

creating a permanent deformation of said substantially planar ground conductor toward said strip conductor.

12. The method recited in claim 10 wherein said adding step comprises adding conductive projections in pairs, each pair comprised of one projection in each substantially planar ground conductor, the projections of a pair having substantially the same length and depth and being aligned opposite each other.

13. The method recited in claim 12 wherein said method comprises:

creating said deformations in ground conductors without disassembling said strip transmission line structure.

14. The method recited in claim 10 wherein said adding step comprises:

adding said pairs of projections in doublets in which each doublet comprises two pairs of said projections spaced apart by a center-to-center distance of substantially one quarter wavelength at a design operating frequency.

15. The method recited in claim 10 wherein said adding step comprises:

adding said projections in triplets in which each triplet comprises first, second and third pairs of projections, adjacent pairs of said projections spaced apart by a center-to-center distance of substantially one quarter wavelength at a design frequency.

16. The method recited in claim 15 wherein said adding step comprises:

creating said first and third pairs with depths and lengths to each produce substantially a first electrical length change; and creating said second pair between said first and third pairs with depths and lengths to produce an electrical length change which is substantially twice said first change.

* * * * *